United States Patent
Qin et al.

(10) Patent No.: US 10,825,397 B2
(45) Date of Patent: Nov. 3, 2020

(54) SHIFT REGISTER UNIT, SHIFT REGISTER CIRCUIT, DRIVING METHOD THEREFOR, AND DISPLAY PANEL

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Wenwen Qin, Beijing (CN); Zhen Wang, Beijing (CN); Jian Sun, Beijing (CN); Xiaozhou Zhan, Beijing (CN); Jiguo Wang, Beijing (CN); Yun Qiao, Beijing (CN); Fei Huang, Beijing (CN); Han Zhang, Beijing (CN); Zhengkui Wang, Beijing (CN); Lele Cong, Beijing (CN)

(73) Assignees: BOE TECHNOLOGY GROUP CO., LTD., Beijing (CN); Ordos Yuansheng Optoelectronics Co., Ltd., Ordos (CN)

( * ) Notice: Subject to any disclaimer, the term of this patent is extended or adjusted under 35 U.S.C. 154(b) by 7 days.

(21) Appl. No.: 16/098,831

(22) PCT Filed: Mar. 21, 2018

(86) PCT No.: PCT/CN2018/079693
§ 371 (c)(1),
(2) Date: Nov. 2, 2018

(87) PCT Pub. No.: WO2018/171593
PCT Pub. Date: Sep. 27, 2018

(65) Prior Publication Data
US 2019/0139495 A1    May 9, 2019

(30) Foreign Application Priority Data

Mar. 22, 2017    (CN) .......................... 2017 1 0175098

(51) Int. Cl.
G09G 3/3266    (2016.01)
G09G 3/36    (2006.01)
G11C 19/28    (2006.01)

(52) U.S. Cl.
CPC ......... *G09G 3/3266* (2013.01); *G09G 3/3677* (2013.01); *G11C 19/28* (2013.01); *G09G 2310/0286* (2013.01); *G09G 2310/08* (2013.01)

(58) Field of Classification Search
CPC ............... G09G 3/3266; G09G 3/3677; G09G 2310/0286; G09G 2310/08; G11C 19/28
See application file for complete search history.

(56) References Cited

U.S. PATENT DOCUMENTS

| | | |
|---|---|---|
| 2013/0088265 A1 | 4/2013 | Chen |
| 2014/0086379 A1 | 3/2014 | Ma et al. |
| 2017/0270892 A1 | 9/2017 | Wang |

FOREIGN PATENT DOCUMENTS

| | | | | |
|---|---|---|---|---|
| CN | 102629444 A | | 8/2012 | |
| CN | 104700805 A | * | 6/2015 | ............. G11C 19/28 |

(Continued)

OTHER PUBLICATIONS

Chinese Office Action dated Sep. 5, 2018, from application No. 201710175098.8.

(Continued)

*Primary Examiner* — Amare Mengistu
*Assistant Examiner* — Jennifer L Zubajlo
(74) *Attorney, Agent, or Firm* — Foley & Lardner LLP

(57) ABSTRACT

The present disclosure relates to a shift register unit. The shift register unit includes a first input circuit configured to transmit a first voltage signal to a pull-up node, a pull-up circuit configured to transmit a first clock signal to a signal output terminal, a first pull-down control circuit configured (Continued)

to transmit a second clock signal to a pull-down node, a second pull-down control circuit configured to transmit a second voltage signal to the pull-down node, a pull-up control circuit configured to transmit the second voltage signal to the pull-up node, a pull-down circuit configured to transmit the second voltage signal to the signal output terminal, and a holding circuit configured to maintain the pull-up node at a low level and/or maintain the pull-down node at a high level under control of a second input.

13 Claims, 3 Drawing Sheets

(56) References Cited

FOREIGN PATENT DOCUMENTS

| | | | | |
|---|---|---|---|---|
| CN | 105118414 A | | 12/2015 | |
| CN | 105304011 A | | 2/2016 | |
| CN | 104091574 B | * | 3/2016 | ........... G11C 19/287 |
| CN | 105741742 A | | 7/2016 | |
| CN | 205564251 U | | 9/2016 | |
| CN | 106710564 A | | 5/2017 | |
| EP | 2 750 122 A1 | | 7/2014 | |
| EP | 2 787 508 A1 | | 10/2014 | |
| KR | 20070104730 A | | 10/2007 | |
| WO | WO-2017/185822 A1 | | 11/2017 | |

OTHER PUBLICATIONS

International Search Report and Written Opinion dated Jun. 21, 2018, from application No. PCT/CN2018/079693.

* cited by examiner

US 10,825,397 B2

SHIFT REGISTER UNIT, SHIFT REGISTER CIRCUIT, DRIVING METHOD THEREFOR, AND DISPLAY PANEL

CROSS-REFERENCE

The present application is based on International Application No. PCT/CN2018/079693, filed on Mar. 21, 2018, which is based upon and claims priority to Chinese Patent Application No. 201710175098.8, filed on Mar. 22, 2017, and the entire contents thereof are incorporated herein by reference.

TECHNICAL FIELD

The present disclosure relates to display technologies, and particularly to a shift register unit, a shift register circuit and a driving method thereof, and a display panel.

BACKGROUND

With the development of optical technologies and semiconductor technologies, flat panel displays represented by liquid crystal displays (LCDs) and organic light emitting diodes (OLEDs) have advantages such as light weight and small size, low energy consumption, fast response, high color purity and high contrast ratio and therefore have dominated the display field.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a shift register unit. The shift register unit include a first input circuit configured to transmit a first voltage signal to a pull-up node under control of a first input signal. The shift register unit includes a pull-up circuit configured to transmit a first clock signal to a signal output terminal under control of a voltage signal of the pull-up node. The shift register unit includes a first pull-down control circuit configured to transmit a second clock signal to a pull-down node under control of the second clock signal. The shift register unit includes a second pull-down control circuit configured to transmit a second voltage signal to the pull-down node under control of a voltage signal of the pull-up node. The shift register unit includes a pull-up control circuit configured to transmit the second voltage signal to the pull-up node under control of a voltage signal of the pull-down node. The shift register unit includes a pull-down circuit configured to transmit the second voltage signal to the signal output terminal under control of a voltage signal of the pull-down node. The shift register unit includes a holding circuit configured to maintain the pull-up node at a low level and/or maintain the pull-down node at a high level under control of a second input signal.

According to another aspect of the present disclosure, there is provided a register circuit. The shift register circuit includes a number of cascaded shift register units as described above. An output signal of the signal output terminal of an M-th stage shift register unit is the first input signal of an (M+1)-th stage shift register unit.

According to another aspect of the present disclosure, there is provided a display panel. The display panel includes a display area and a peripheral area. The peripheral area is provided with the shift register circuit as described above.

According to another aspect of the present disclosure, there is provided a shift register circuit driving method for driving the shift register circuit as described above. The driving method includes after the signal output terminal of the last stage shift register unit outputs a high level in each frame period, controlling the pull-up node to be at a low vale and/or controlling the pull-down node to be at a high level by using the second input signal.

The above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary arrangements of the present disclosure. The drawings along with the specification explain the principles of the present disclosure. It is apparent that the drawings in the following description show only some of the arrangements of the present disclosure, and other drawings may be obtained by those skilled in the art without departing from the drawings described herein.

DETAILED DESCRIPTION

Figure 1:
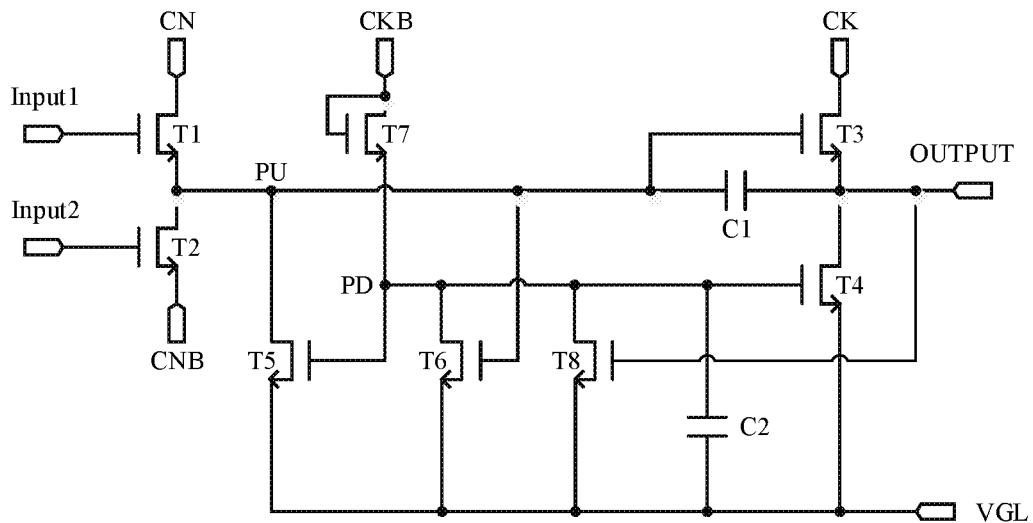
FIG. 1 is a schematic structural view showing a shift register unit in related arts.

Example arrangements will now be described more fully with reference to the accompanying drawings. However, the arrangements can be implemented in a variety of forms and should not be construed as being limited to the examples set forth herein; rather, these arrangements are provided so that this disclosure will be more complete so as to convey the idea of the exemplary arrangements to those skilled in this art. The described features, structures, or characteristics in one or more arrangements may be combined in any suitable manner.

In addition, the drawings are merely schematic representations of the present disclosure and are not necessarily drawn to scale. The same reference numerals in the drawings denote the same or similar parts, and the repeated description thereof will be omitted. Some of the block diagrams shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

In related arts, display devices have recently shown a trend of high integration and low cost. The Gate Driver on Array (GOA) technology is a representative technology. The GOA technology is used to integrate a gate drive circuit into the peripheral area of an array substrate, thus effectively improving the integration of the display device while achieving a narrow bezel design, and reducing manufacturing costs. The output terminal of each stage of shift register unit in the GOA circuit is coupled to a corresponding gate line for outputting a gate scan signal to the gate line to implement a line-by-line scan function. However, since the switching elements in the shift register unit usually are thin film transistors (TFTs), and the TFTs themselves have leakage current and parasitic capacitance, and thus the shift register circuit often has various defects, resulting in display abnormality.

Figure 2:
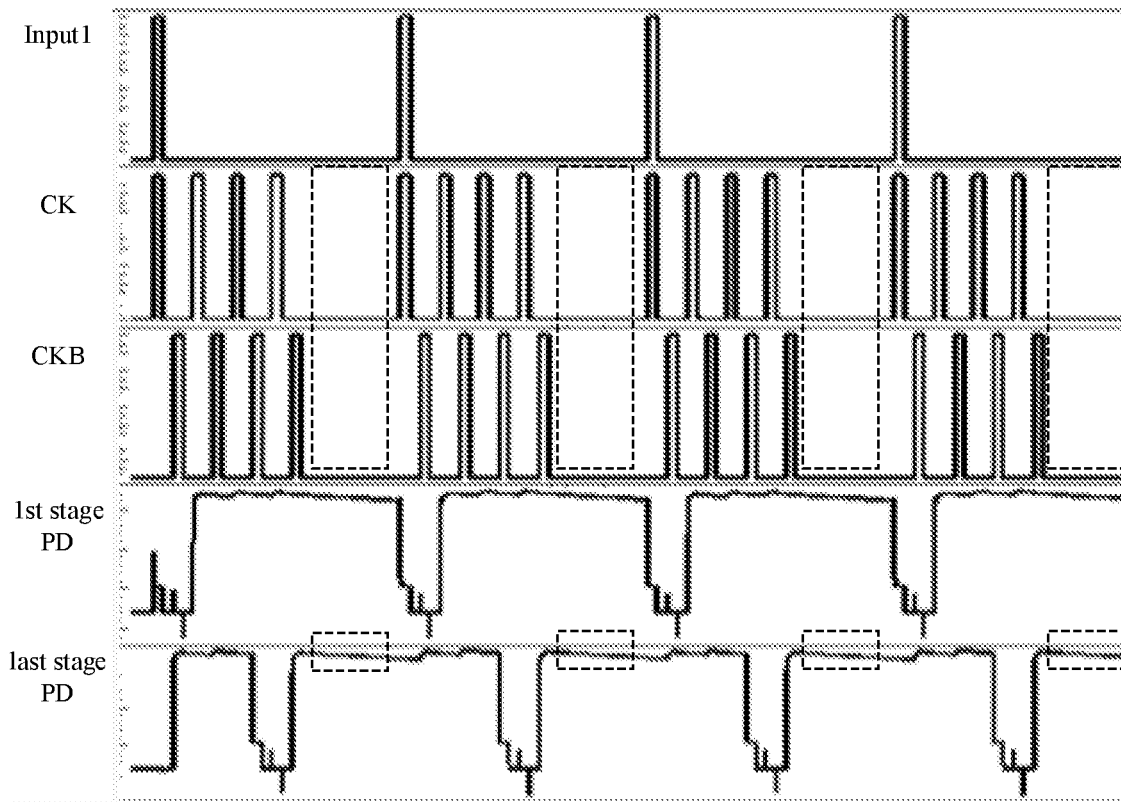
FIG. 2 shows a timing diagram to operate the shift register unit of FIG. 1.

FIGS. 1 and 2 respectively show a shift register unit and a timing diagram to operate the same. As shown in these figures, when a pull-up node PU is at a high level, a sixth transistor T6 is turned on to pull the level of a pull-down node PD low. When the pull-down node PD is at a high level, a fifth transistor T5 is turned on to pull the level of the pull-up node PU low. In one frame time, the pull-down node PD remains high for most of the time, and the pull-up node PU remains low for most of the time. During V Blank (the time from the last line to the first line after the terminal of each frame scan), a first clock signal CK and a second clock signal CKB are both at a low level, and the pull-down node PD can only rely on the second capacitor C2 to remain at a high level. When the leakage current is large, the level of the pull-down node PD will be lowered, and the level of the pull-up node PU cannot be completely pulled down. As a result, since the first clock signal CK and the pull-up node PU are connected to the gate and the source of the same transistor, the parasitic capacitance between the two is large, at the beginning of the next frame, the pull-up node PU will be coupled with the waveform of the first clock signal CK, which causes the third transistor T3 to be abnormally turned on, resulting in display abnormality.

Figure 3:
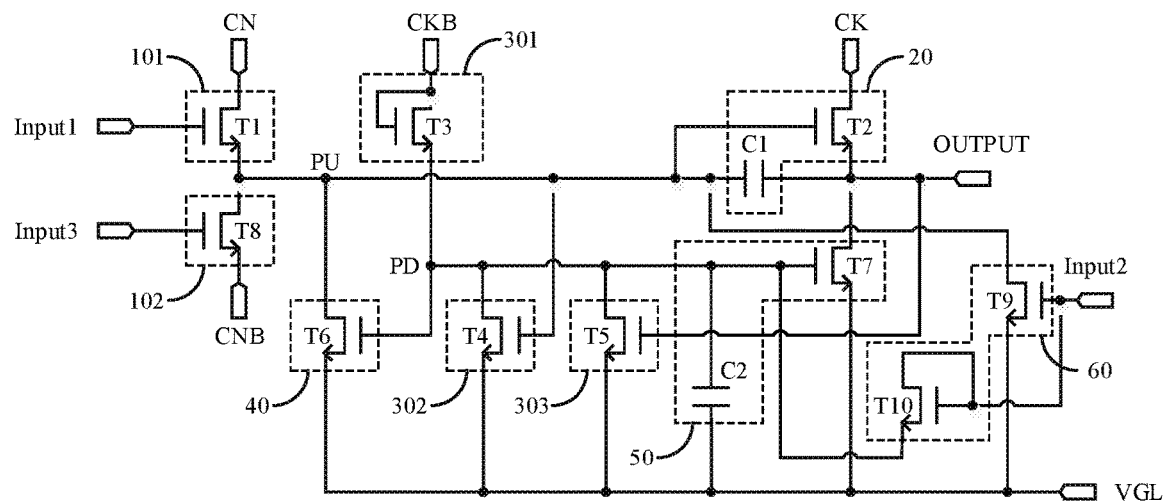
FIG. 3 is a schematic block diagram showing a structure of a shift register unit according to an exemplary arrangement of the present disclosure.

An exemplary arrangement of the present disclosure provides a shift register unit for providing a gate scan signal. As shown in FIG. 3, the shift register unit may include a first input circuit 101, a pull-up circuit 20, a first pull-down control circuit 301, a second pull-down control circuit 302, a third pull-down mode control circuit 303, a pull-up control circuit 40, a pull-down circuit 50 and a holding circuit 60.

The first input circuit 101 is configured to transmit a first voltage signal CN to a pull-up node PU under control of a first input signal Input1.

The pull-up circuit 20 is configured to transmit a first clock signal CK to a signal output terminal OUTPUT under control of a voltage signal of the pull-up node PU.

The first pull-down control circuit 301 is configured to transmit a second clock signal CKB to a pull-down node PD under control of the second clock signal CKB.

The second pull-down control circuit 302 is configured to transmit a second voltage signal VGL to the pull-down node PD under control of the voltage signal of the pull-up node PU.

The third pull-down mode control circuit 303 is configured to transmit the second voltage signal VGL to the pull-down node PD under control of the voltage signal of the signal output terminal OUTPUT.

The pull-up control circuit 40 is configured to transmit the second voltage signal VGL to the pull-up node PU under control of the voltage signal of the pull-down node PD.

The pull-down circuit 50 is configured to transmit the second voltage signal VGL to the signal output terminal OUTPUT under control of the voltage signal of the pull-down node PD.

The holding circuit 60 is configured to keep the pull-up node PU at a low level and/or keep the pull-down node PD at a high level under control of a second input signal Input2.

In the shift register unit provided by the exemplary arrangement of the present disclosure, the holding circuit 60 can keep the low-level state of the pull-up node PU and/or keep the high-level state of the pull-down node PD using the second input Input2 during the V-blank time period after the last stage of shift register unit outputs a high level signal in each frame. In this way, the present disclosure can prevent abnormal output of the scan signals and avoid occurrence of bad display.

In some arrangements, the holding circuit 60 may specifically include a first holding unit and/or a second holding unit. The first holding unit is configured to transmit the second voltage signal VGL to the pull-up node PU under control of the second input signal Input2 to keep the pull-up node at a low level. The second holding unit is configured to transmit the second input signal Input2 to the pull-down node PD under control of the second input signal Input2 to keep the pull-down node at a high level.

It should be noted that the holding circuit 60 may only include the first holding unit to keep the pull-up node PU at a low-level state; or the holding circuit 60 may only include the second holding unit to enable the pull-down node at a high-level state, and then the second voltage signal VGL is transmitted to the pull-up node PU through the pull-up control circuit 40 to maintain the low-level state of the pull-up node PU. Of course, the holding circuit 60 can also include both the first holding unit and the second holding unit so as to limit the levels of both the pull-up node PU and the pull-down node PD. It can be seen that the purpose of providing the holding circuit 60 in the present arrangement is to prevent the abnormal output of the scan signal(s). As long as the above effect can be achieved, the holding circuit 60 can be provided with one holding unit or multiple holding units, and the present disclosure does not impose specific limitations on this.

In some arrangements, as shown in FIG. 3, the shift register unit may further include: a second input circuit 102 configured to transmit a third voltage signal CNB to the pull-up node PU under control of a third input signal Input3.

The first voltage signal CN and the third voltage signal CNB are mutually opposite signals. That is, if the first voltage signal CN is a high level signal, the third voltage signal CNB is a low level signal; if the first voltage signal CN is a low level signal, the third voltage signal CNB are a high level signal.

Based on this, both the first input circuit 101 and the second input circuit 102 function to transmit the input signal(s) to the pull-up node PU, the only difference is that the input signals are different. In this way, by controlling the levels of the first voltage signal CN and the third voltage signal CNB, and the start signal pulse, the effect of controlling the scanning order can be achieved. Specifically, if the first voltage signal CN is at a high level and the third voltage signal CNB is at a low level, the scanning sequence is a forward scan; on the contrary, if the first voltage signal CN is at a low level and the third voltage signal CNB is at a high level, the scan order is a reverse scan. On this basis, once the scanning order is determined, one of the first input circuit 101 and the second input circuit 102 can serve as a trigger module, and the other can function as a reset module.

Figure 4:
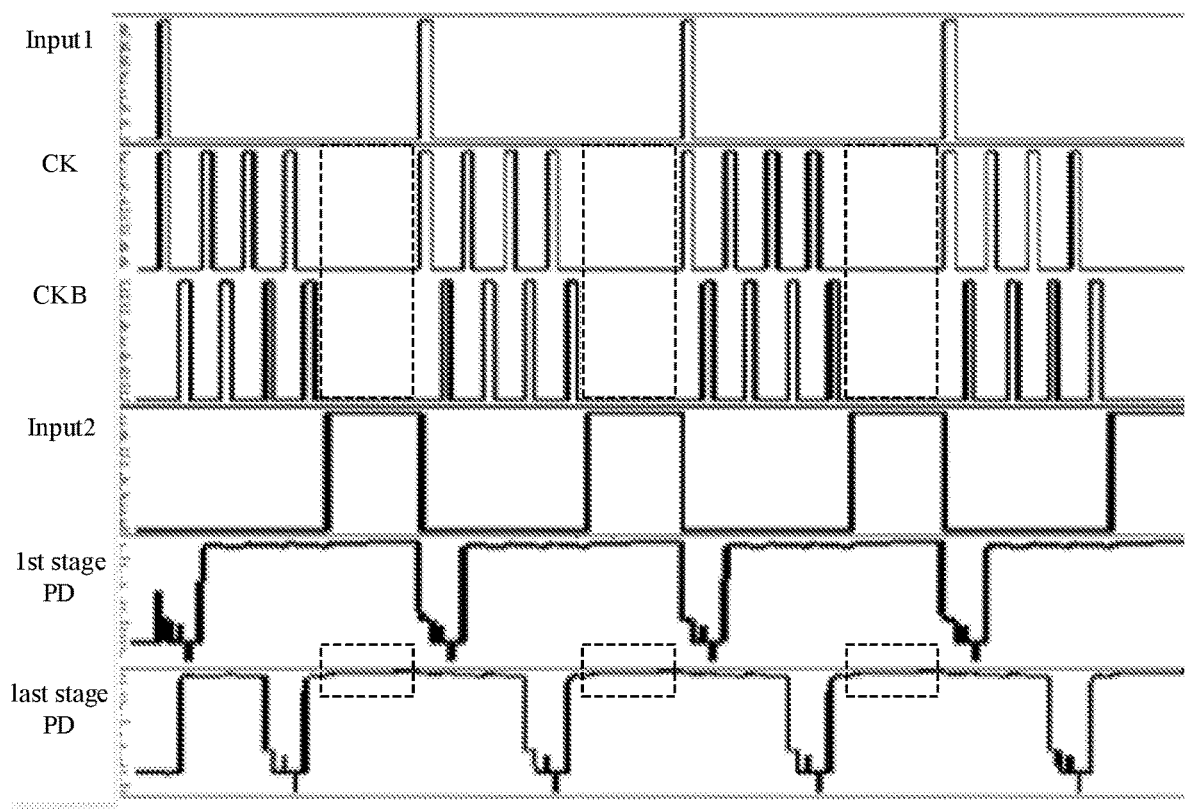
FIG. 4 shows operation timing of a shift register unit according to an exemplary arrangement of the present disclosure.

The shift register unit in the present exemplary arrangement will be described in detail below with reference to FIGS. 3 and 4.

The first input circuit 101 may include a first switching element. A control terminal of the first switching element receives the first input signal Input1, a first terminal of the first switching element receives the first voltage signal CN, and a second terminal of the first switching element is connected to the pull-up node PU.

The second input circuit 102 can include an eighth switching element. A control terminal of the eighth switching element receives the third input signal Input3, a first terminal of the eighth switching element receives the third voltage signal CNB, and a second terminal of the eighth switching element is coupled to the pull-up node PU.

The pull-up circuit 20 may include a second switching element and a first capacitor C1. A control terminal of the second switching element is connected to the pull-up node PU, a first terminal of the second switching element receives the first clock signal CK, a second terminal of the second switching element is connected to the signal output terminal OUTPUT. A first terminal of the first capacitor C1 is connected to the pull-up node PU and a second terminal of the first capacitor C1 is connected to the signal output terminal OUTPUT.

The first pull-down control circuit 301 may include a third switching element. A control terminal of the third switching element receives the second clock signal CKB, a first terminal of the third switching element receives the second clock signal CKB, and a second terminal of the third switching element is connected to the pull-down node PD.

The second pull-down control circuit 302 may include a fourth switching element. A control terminal of the fourth switching element is connected to the pull-up node PU, a first terminal of the fourth switching element receives the second voltage signal VGL, and a second terminal of the fourth switching element is connected to the pull-down node PD.

The third pull-down control circuit 303 may include a fifth switching element. A control terminal of the fifth switching element is connected to the signal output terminal OUTPUT, a first terminal of the fifth switching element receives the second voltage signal VGL, and a second terminal of the fifth switching element is connected to the pull-down node PD.

The pull-up control circuit 40 may include a sixth switching element. A control terminal of the sixth switching element is connected to the pull-down node PD, a first terminal of the sixth switching element receives the second voltage signal VGL, and a second terminal of the sixth switching element is connected to the pull-up node PU.

The pull-down circuit 50 may include a seventh switching element and a second capacitor C2. A control terminal of the seventh switching element is connected to the pull-down node PD, a first terminal of the seventh switching element receives the second voltage signal VGL, a second terminal of the seventh switching element is connected to the signal output terminal OUTPUT. A first terminal of the second capacitor C2 is connected to the pull-down node PD, and a second terminal of the second capacitor C2 receives the second voltage signal VGL.

The holding circuit 60 can include a first holding unit and/or a second holding unit. The first holding unit may include a ninth switching element. A control terminal of the ninth switching element receives the second input signal Input2, a first terminal of the ninth switching element receives the second voltage signal VGL, and a second terminal of the ninth switching element is connected to the pull-up node PD. The second holding unit may include a tenth switching element. A control terminal of the tenth switching element receives the second input signal Input2, a first terminal of the tenth switching element receives the second input signal Input2, and a second terminal of the tenth switching element is connected to the pull-down node PD.

In some arrangements, all of the switching elements may be MOS (Metal Oxide Semiconductor) transistors and they may all be P-type MOS transistors or N-type MOS transistors. It should be noted that for different transistor types, the level signals of the respective signal terminals need to be changed.

The working principle of the shift register unit in this arrangement will be specifically described below with reference to FIG. 4 which shows the operation timing of the shift register unit. In the following descriptions, for example, all switching elements are NMOS. The first voltage signal CN is a high level signal, the second voltage signal VGL is a DC low level signal, and the third voltage signal CNB is a low level signal.

The working process of the shift register circuit may include the following stages:

First Stage t1:

The first input signal Input1 is at a high level, the first transistor T1 is turned on to transmit the first voltage signal CN to the pull-up node PU to charge the first capacitor C1, and the pull-up node PU is at a high level. The fourth transistor T4 is turned on to pull the level of the pull-down node PD by the second voltage signal VGL under the high level of the pull-up node PU, and the sixth transistor T6 and the seventh transistor T7 are turned off. The first clock signal CK is at a high level, and under the high level of the pull-up node PU, the second transistor T2 is turned on to transmit the first clock signal CK to the signal output terminal OUTPUT, and at this time, a high level signal is output. Under the high level of the signal output terminal OUTPUT, the fifth transistor T5 is turned on to pull down the level of the pull-down node PD by using the second voltage signal VGL.

Second Stage t2:

The first input signal Input1 is at a low level, the first transistor T1 is turned off, and at this time, the first capacitor C1 is discharged to keep the pull-up node PU at a high level. The second clock signal CKB is at a high level, the third The transistor T3 is turned on to transmit the second clock signal CKB to the pull-down node PD to charge the second capacitor C2, and the pull-down node PD is at a high level. Under the high level of the pull-down node PD, the sixth transistor T6 is turned on so as to pull down the level of the pull-up node PU by using the second voltage signal VGL. And, the second transistor T2 and the fourth transistor T4 are turned off. Meanwhile, the seventh transistor T7 is turned on, and the second voltage signal VGL is used to pull down the level of the signal output terminal OUTPUT.

Third Stage t3:

The first input signal Input1 is at a low level, the first transistor T1 is turned off. The second capacitor C2 is discharged to keep the pull-down node PD at a high level, and the sixth transistor T6 is turned on to continue to pull down the level of the pull-up node PU. And, the second transistor T2 and the fourth transistor T4 are turned off. Meanwhile, the seventh transistor T7 is turned on to continue to pull down the level of the signal output terminal OUTPUT, and the fifth transistor T5 is turned off.

Fourth Stage t4:

The first input signal Input1 is at a low level, and the first transistor T1 is turned off. The second clock signal CKB is at a high level, and the third transistor T3 is turned on to transmit the second clock signal CKB to the pull-down node PD to charge the second capacitor C2, and the pull-down node PD is at a high level. Under the high level of the pull-down node PD, the sixth transistor T6 is turned on to pull down the level of the pull-up node PU by using the second voltage signal VGL. And, the second transistor T2 and the fourth transistor T4 are turned off. Meanwhile, the seventh transistor T7 is turned on, and the level of the signal output terminal OUTPUT is pulled down by the second voltage signal VGL.

N-th Stage Tn (where N and n can be any Positive Integer Greater than 4):

The first input signal Input1 is at a low level, and the first clock signal CK and the second clock signal CKB are both at a low level, that is, at V Blank time (returning to the first line from the last line after each frame scan is ended). At this time, the second input signal Input2 is at a high level, the ninth transistor T9 and the tenth transistor T10 are turned on, and the second voltage signal VGL is transmitted to the pull-up node PU through the ninth transistor T9 to keep the pull-up node PU at a low-level state. The second input signal Input2 is transmitted to the pull-down node PD through the tenth transistor T10 to keep the pull-down node PD at a high-level state.

It should be noted that, between the fourth stage t4 and the nth stage tn, the shift register units of the stages repeat the above-mentioned third stage t3 and the fourth stage t4 according to actual situations until the signal output terminal PUTPUT of the last stage shift register unit outputs a high level signal.

Based on the above process, the holding circuit 60 starts to work in the V-blank time after the shift register unit in the last stage outputs the high level signal in each frame, and the holding circuit 60 uses the second input signal Input2 to hold the low-level state of the pull-up node PU and the high-level state of the pull-down node Pd. Thus, the present disclosure can prevent abnormal turning-on of the second transistor T2 which may cause an abnormal output of the scan signal.

Figure 5:
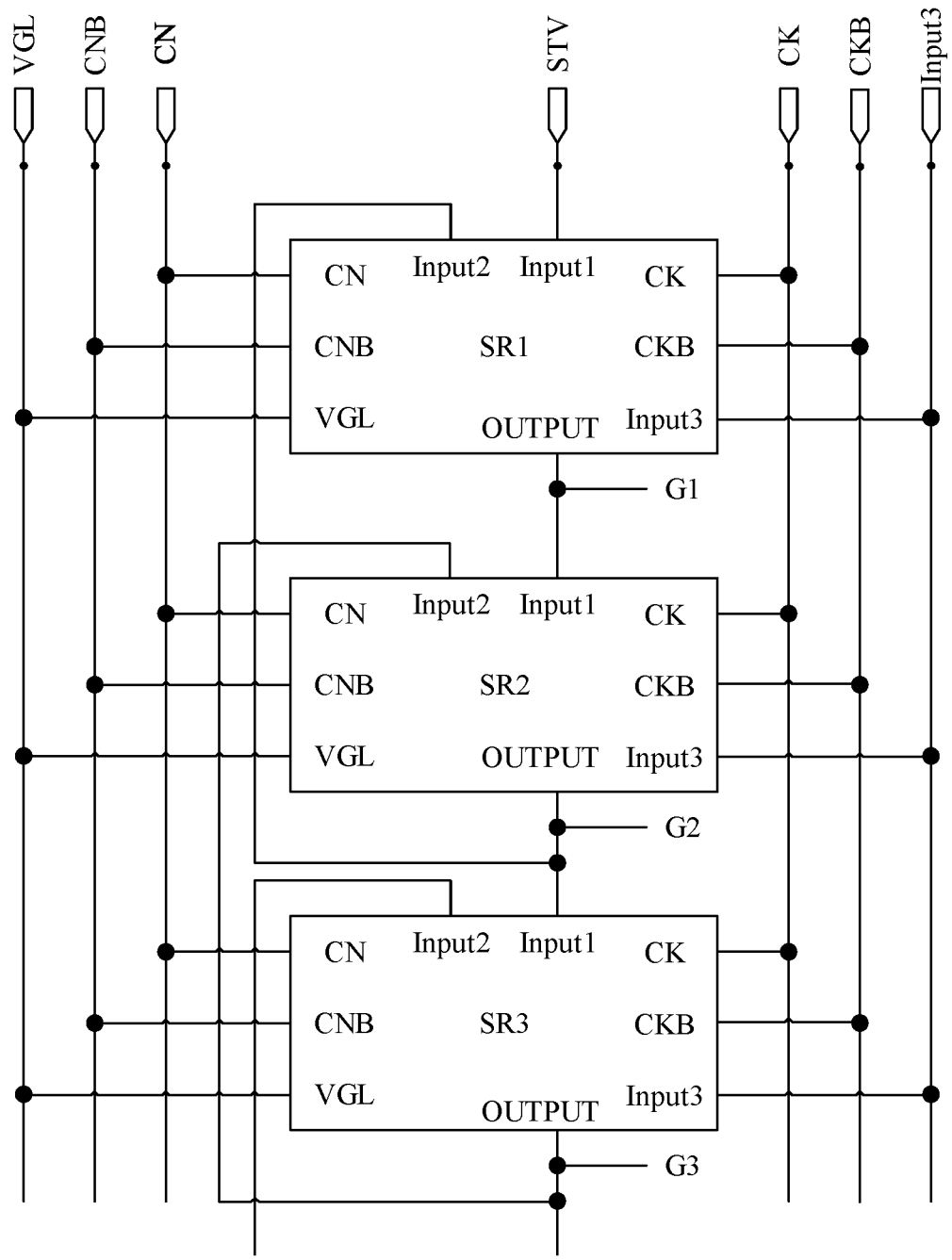
FIG. 5 schematically shows a cascade structure diagram of a shift register circuit according to an exemplary arrangement of the present disclosure.

An exemplary arrangement of the present disclosure further provides a shift register circuit which may be used as a gate driving circuit. As shown in FIG. 5, the shift register circuit may include a plurality of cascaded shift register units. The output signal of the signal output terminal OUTPUT of the M-th stage shift register unit is the first input signal Input1 of the (M+1)-th stage shift register unit, where M can be any positive integer.

Based on this, the scan mode of the shift register circuit may include a forward scan or a reverse scan.

When the forward scan is used, the first voltage signal CN may be at a high level, the third voltage signal CNB may be at a low level, and the first input signal Input1 of the first stage shift register unit is a start signal.

When the reverse scan is used, the first voltage signal CN may be at a low level, the third voltage signal CNB may be at a high level, and the third input signal Input3 of the last stage shift register unit is a start signal.

It should be noted that the specific details of each circuit or unit in the shift register circuit have been described in detail in the arrangements regarding the shift register unit, and repeated descriptions are omitted here.

An exemplary arrangement of the present disclosure further provides a display panel including a display area and a peripheral area, and the above-described shift register circuit is provided in the peripheral area.

Based on this, the present arrangement utilizes the GOA technology to integrate the shift register circuit onto the periphery of the display panel, thus realizing the narrow bezel panel and reducing the manufacturing cost of the display panel.

The display panel may be an LCD display panel, an OLED display panel, a PLED (Polymer Light-Emitting Diode) display panel, a PDP (Plasma Display Panel), or the like. The present disclosure does not impose specific limitations on the display panels.

An exemplary arrangement of the present disclosure also provides a display device including the above display panel. The display device may include any product or component having a display function, such as a mobile phone, a tablet computer, a television, a notebook computer, a digital photo frame, a navigator, and the like.

It should be noted that although modules or units of devices for executing functions are described above, such division of modules or units is not mandatory. In fact, features and functions of two or more of the modules or units described above may be embodied in one circuit or unit in accordance with the arrangements of the present disclosure. Alternatively, the features and functions of one circuit or unit described above may be further divided into multiple modules or units.

In addition, although the various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Through the description of the above arrangements, those skilled in the art will readily understand that the exemplary arrangements described herein may be implemented by software or by a combination of software with necessary hardware. Therefore, the technical solutions according to arrangements of the present disclosure may be embodied in the form of a software product, which may be stored in a non-volatile storage medium (which may be a CD-ROM, a USB flash drive, a mobile hard disk, etc.) or on a network. A number of instructions are included to cause a computing device (which may be a personal computer, server, mobile terminal, or network device, etc.) to perform the methods in accordance with the arrangements of the present disclosure.

Other arrangements of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and arrangements are illustrative, and the real scope and spirit of the present disclosure is defined by the appended claims.

What is claimed is:

1. A shift register unit, comprising:
   a first input circuit configured to transmit a first voltage signal to a pull-up node under control of a first input signal;
   a pull-up circuit configured to transmit a first clock signal to a signal output terminal under control of a voltage signal of the pull-up node;
   a first pull-down control circuit configured to transmit a second clock signal to a pull-down node under control of the second clock signal;

a second pull-down control circuit configured to transmit a second voltage signal to the pull-down node under control of the voltage signal of the pull-up node;

a pull-up control circuit configured to transmit the second voltage signal to the pull-up node under control of a voltage signal of the pull-down node;

a pull-down circuit configured to transmit the second voltage signal to the signal output terminal under control of the voltage signal of the pull-down node; and a holding circuit comprising at least one of a first holding unit and a second holding unit;

wherein the first holding unit is configured to transmit the second voltage signal to the pull-up node under control of the second input signal during a V-blank time period, the V-blank time period is a time period after a last stage of shift register unit outputs a high level signal in each frame;

wherein the second holding unit is configured to transmit the second input signal to the pull-down node under control of the second input signal during the V-blank time period;

wherein the shift register unit further comprises a third pull-down control circuit configured to transmit the second voltage signal to the pull-down node under control of a voltage signal of the signal output terminal.

2. The shift register unit of claim 1, further comprising:
a second input circuit configured to transmit a third voltage signal to the pull-up node under control of a third input signal.

3. The shift register unit of claim 2, wherein the second input circuit comprises:
an eighth switching element, wherein a control terminal of the eighth switching element receives the third input signal, a first terminal of the eighth switching element receives the third voltage signal, and a second terminal of the eighth switching element is connected to the pull-up node.

4. The shift register unit of claim 1, wherein the first input circuit comprises:
a first switching element, wherein a control terminal of the first switching element receives the first input signal, a first terminal of the first switching element receives the first voltage signal, and a second terminal of the first switching element is connected to the pull-up node.

5. The shift register unit of claim 1, wherein the pull up circuit comprises:
a second switching element, wherein a control terminal of second switching element is connected to the pull-up node, a first terminal of the second switching element receives the first clock signal, and a second terminal of the second switching element is connected to the signal output terminal; and a first capacitor, wherein a first terminal of the first capacitor is connected to the pull-up node, and a second terminal of the first capacitor is connected to the signal output terminal.

6. The shift register unit of claim 1, wherein:
the first pull-down control circuit comprises:
a third switching element, wherein a control terminal of the third switching element receives the second clock signal, a first terminal of the third switching element receives the second clock signal, and a second terminal of the third switching element is connected to the pull-down node;
the second pull-down control circuit comprises:
a fourth switching element, wherein a control terminal of the fourth switching element is connected to the pull-up node, a first terminal of the fourth switching element receives the second voltage signal, and a second terminal of the fourth switching element is connected to the pull-down node;

the third pull-down control circuit comprises:
a fifth switching element, wherein a control terminal of the fifth switching element is connected to the signal output terminal, a first terminal of the fifth switching element receives the second voltage signal, and a second terminal of the fifth switching element is connected to the pull-down node.

7. The shift register unit of claim 1, wherein the pull-up control circuit comprises:
a sixth switching element, wherein a control terminal of the sixth switching element is connected to the pull-down node, a first terminal of the sixth switching element receives the second voltage signal, and a second terminal of the sixth switching element is connected to the pull-up node.

8. The shift register unit of claim 1, wherein the pull-down circuit comprises:
a seventh switching element, wherein a control terminal of the seventh switching element is connected to the pull-down node, a first terminal of the seventh switching element receives the second voltage signal, and a second terminal of the seventh switching element is connected to the signal output terminal; and a second capacitor, wherein a first terminal of the second capacitor is connected to the pull-down node, and a second terminal of second capacitor receives the second voltage signal.

9. The shift register unit of claim 1, wherein:
the first holding unit comprises:
a ninth switching element, wherein a control terminal of the ninth switching element receives the second input signal, a first terminal of the ninth switching element receives the second voltage signal, and a second terminal of the ninth switching element is connected to the pull-up node;

the second holding unit includes:
a tenth switching element, where a control terminal of the tenth switching element receives the second input signal, a first terminal of the tenth switching element receives the second input signal, and a second terminal of the tenth switching element is connected to the pull-down node.

10. A shift register circuit, comprising a plurality of cascaded shift register units;
wherein each of the shift register units comprises:
a first input circuit configured to transmit a first voltage signal to a pull-up node under control of a first input signal;

a pull-up circuit configured to transmit a first clock signal to a signal output terminal under control of a voltage signal of the pull-up node;

a first pull-down control circuit configured to transmit a second clock signal to a pull-down node under control of the second clock signal;

a second pull-down control circuit configured to transmit a second voltage signal to the pull-down node under control of the voltage signal of the pull-up node;

a pull-up control circuit configured to transmit the second voltage signal to the pull-up node under control of a voltage signal of the pull-down node;

a pull-down circuit configured to transmit the second voltage signal to the signal output terminal under control of the voltage signal of the pull-down node; and a holding circuit configured;

wherein an output signal of the signal output terminal of an M-th stage shift register unit is the first input signal of an (M+1)-th stage shift register unit;

wherein the holding circuit comprises at least one of a first holding unit and a second holding unit;

wherein the first holding unit is configured to transmit the second voltage signal to the pull-up node under control of the second input signal during a V-blank time period, the V-blank time period is a time period after a last stage of shift register unit outputs a high level signal in each frame;

wherein the second holding unit is configured to transmit the second input signal to the pull-down node under control of the second input signal during the V-blank time period;

wherein the shift register unit further comprises a third pull-down control circuit configured to transmit the second voltage signal to the pull-down node under control of a voltage signal of the signal output terminal.

11. The shift register circuit of claim 10, wherein a scan mode of the shift register circuit comprises a forward scan or a reverse scan;

during the forward scan, the first voltage signal is at a high level, and the second voltage signal is at a low level;

during the reverse scan, the first voltage signal is at a low level and the second voltage signal is at a high level.

12. A display panel, comprising a display area and a peripheral area; wherein the peripheral area is provided with the shift register circuit of claim 10.

13. A shift register circuit driving method for driving the shift register circuit of claim 10 wherein the driving method comprises:

after a signal output terminal of a last stage shift register unit outputs a high level in each frame period, controlling the pull-up node to be at a low value and/or controlling the pull-down node to be at a high level by using the second input signal.

* * * * *